United States Patent
Clevenger et al.

(10) Patent No.: US 7,902,061 B2
(45) Date of Patent: *Mar. 8, 2011

(54) INTERCONNECT STRUCTURES WITH ENCASING CAP AND METHODS OF MAKING THEREOF

(75) Inventors: Lawrence A. Clevenger, LaGrangeville, NY (US); Timothy J. Dalton, Ridgefield, CT (US); Louis C. Hsu, Fishkill, NY (US); Carl Radens, LaGrangeville, NY (US); Theodorus E. Standaert, Pine Bush, NY (US); Keith Kwong Hon Wong, Wappingers Falls, NY (US); Chih-Chao Yang, Poughkeepsie, NY (US)

(73) Assignee: International Business Machines Corporation, Yorktown Heights, NY (US)

( * ) Notice: Subject to any disclaimer, the term of this patent is extended or adjusted under 35 U.S.C. 154(b) by 245 days.

This patent is subject to a terminal disclaimer.

(21) Appl. No.: 12/199,407

(22) Filed: Aug. 27, 2008

(65) Prior Publication Data

US 2008/0318415 A1 Dec. 25, 2008

Related U.S. Application Data

(60) Division of application No. 11/503,259, filed on Aug. 14, 2006, now Pat. No. 7,488,677, which is a continuation of application No. 11/034,890, filed on Jan. 14, 2005, now Pat. No. 7,105,445.

(51) Int. Cl.
*H01L 21/4763* (2006.01)

(52) U.S. Cl. ... 438/618; 438/680; 438/687; 257/E21.006; 257/E21.17; 257/E21.278; 257/E21.293; 257/E21.311

(58) Field of Classification Search ............ 438/618, 438/680, 687, 9, 637, 723, 756, 683, 685, 438/686; 257/E21.17, 6, 278, 293, 311
See application file for complete search history.

(56) References Cited

U.S. PATENT DOCUMENTS

| | | |
|---|---|---|
| 5,581,110 A | 12/1996 | Razouk et al. |
| 5,686,760 A * | 11/1997 | Miyakawa .................... 257/751 |
| 5,695,810 A | 12/1997 | Dubin et al. |
| 5,889,328 A | 3/1999 | Joshi et al. |
| 6,103,625 A | 8/2000 | Marcyk et al. |
| 6,157,081 A | 12/2000 | Nariman et al. |
| 6,215,129 B1 | 4/2001 | Harvey et al. |
| 6,294,799 B1 | 9/2001 | Yamazaki et al. |
| 6,391,669 B1 | 5/2002 | Fasano et al. |
| 6,492,263 B1 | 12/2002 | Peng et al. |
| 6,689,683 B2 | 2/2004 | Yamamoto |
| 7,105,445 B2 * | 9/2006 | Wong et al. ................... 438/687 |
| 7,150,445 B2 | 12/2006 | Faye et al. |
| 7,488,677 B2 * | 2/2009 | Wong et al. ................... 438/618 |
| 2003/0111729 A1 | 6/2003 | Leu et al. |

* cited by examiner

*Primary Examiner* — David Nhu

(74) *Attorney, Agent, or Firm* — Connolly Bove Lodge & Hutz LLP; Louis Percello

(57) ABSTRACT

A method of making an interconnect structure: which includes providing an interconnect structure in a dielectric material, recessing the dielectric material such that a portion of the interconnect structure extends above an upper surface of the dielectric material; and depositing an encasing cap over the extended portion of the interconnect structure.

22 Claims, 4 Drawing Sheets

INTERCONNECT STRUCTURES WITH ENCASING CAP AND METHODS OF MAKING THEREOF

CROSS REFERENCE TO RELATED APPLICATIONS

This application is a Divisional of U.S. application Ser. No. 11/503,259, filed Aug. 14, 2006, which issued as U.S. Pat. No. 7,488,677 on Feb. 10, 2009, which is a continuation of U.S. application Ser. No. 11/034,890, filed Jan. 14, 2005, which issued as U.S. Pat. No. 7,105,445 on Sep. 12, 2006. The entire contents of each of the above-applications are incorporated herein by reference.

FIELD OF THE INVENTION

The invention is directed to interconnect structure such as via and trench metallization in an integrated circuit. In particular, the invention is directed to via and trench metallization, structures with an encasing cap, and methods of making the structures.

BACKGROUND OF THE INVENTION

As integrated circuits become more complex, process integration requires several processes. Also, the continuing miniaturization, of electronic devices requires that interconnects be positioned at multi levels in the device. For copper, the requirement of several layers of metallization becomes increasingly complicated by the associated requirement of etch stop and diffusion harrier structures at each level.

In damascene processing, the interconnect structure or wiring pattern is formed within trenches or vias formed within a dielectric film. Using known techniques a photoresist material is used to define the wiring pattern. The patterned photoresist acts as a mask through which a pattern of the dielectric material is removed by a subtractive etch process such as plasma etching or reactive ion etching. The etched openings are used to define wiring patterns in the dielectric layer. These wiring patterns can extend from one surface of the dielectric layer to the other surface of the dielectric layer. Alternatively, the wiring patterns can be confined to a single layer, that is not extend to the opposite surface of the dielectric layer.

The wiring patterns are then filled with a metal using a filling technique such as electroplating, electroless plating, chemical vapor deposition, physical vapor deposition or a combination thereof. A harrier layer is typically used to minimize atomic diffusion of the conductive metals into the dielectric.

In the single damascene process, via openings are provided in the dielectric layer and filled with a conducting metal, which is often referred to as metallization, to provide electrical contact between layers of wiring levels. In the dual damascene process, the via openings and die wiring pattern openings are both provided in the dielectric layer before filling with fee conducting metal. The dual damascene process can simplify the manufacturing process by eliminating some internal interlaces. Damascene processing followed by metallization is continued for each layer in the electronic component until the electronic device is completed.

Barrier layers are often needed between the dielectric material and the conductive material in order to prevent atoms of the conductive material from diffusing into and at times through the dielectric material and into other active circuit device structures. Diffusion of conductive material in the device can cause inter-level or intra-level snorts through the dielectric material. Also, junction leakage can result, and threshold voltage ($V_t$) levels of the transistors formed within the substrate can shift. In some-cases, device functionality can be destroyed.

Diffusion is a particular concern when a high diffusivity element is used as a conductive material in the semiconductor structures. For example copper atoms often exhibit relatively high diffusion mobility in most dielectric materials. Yet, in spite of this problem, copper is a favored material for interconnects because of its superior conductivity.

FIGS. 1A and 1B are representational cross-sectional views of process steps taken to provide a copper interconnect of die prior art. With reference to FIG. 1A, a dual-damascene copper interconnect is represented, which includes trench 16 and via 17, copper line 12 embedded in dielectric 10, cap layer 14 (e.g. silicon nitride, silicon carbide, or silicon oxide) and interlayer dielectric 15. As shown, via 17 is etched in the interlayer dielectric 15 and the cap layer 14 to expose copper line 12. Typically, a barrier layer (e.g. tantalum, tantalum nitride) is deposited on the patterned interlayer dielectric using a PVD process. A copper seed layer is then deposited over the barrier layer, followed by a Cu plating process to fill the trench 16 and via 17 with copper 18 as shown in FIG. 1B.

Misalignment of one patterned interlayer over another interlayer each with its embedded, interconnect structures often leads to vias that do not fully land on the underlying conducting lines or conducting lines that do not fully land on the underlying vias. Unlanded vias and lines can significantly reduce electrical connection to the lower metallization and result in low process yield or in field failures. As a result, electronic circuits are designed with specific alignment tolerance values, for example, in 65 nm node technology, via diameter is about 100 nm and the overlay budget is about 40 nm. Therefore, there is an interest to provide interconnect structures with relaxed manufacturing tolerance values, particularly for high-density wiring designs.

SUMMARY OF THE INVENTION

The invention is directed to a method of making an interconnect structure. The method comprises: providing an interconnect structure in a dielectric material, recessing the dielectric material such that a portion of the interconnect structure extends above an upper surface of the dielectric; and depositing an encasing cap over the extended portion of the interconnect structure.

The invention is also directed to an interconnect structure comprising: a metal conductor disposed in a dielectric material with a portion of the metal conductor extending above a surface of the dielectric material. The extending portion of the metal conductor is encased with a cap.

BRIEF DESCRIPTION OF THE DRAWINGS

This invention will be better understood by reference to the Detailed Description, of the Invention when taken together with the attached drawings, wherein.

DETAILED DESCRIPTION OF THE INVENTION

The present invention is directed to a method of making an interconnect structure. This method comprises; providing an interconnect structure in a dielectric material, recessing the dielectric material such that a portion of the interconnect structure extends above an upper surface of the dielectric; and depositing an encasing cap over the extended portion of the interconnect structure. The method, can also include depositing a second dielectric material above the encasing cap. The term "dielectric material" refers to a first deposited dielectric layer or an interlayer dielectric.

Figure 1A:
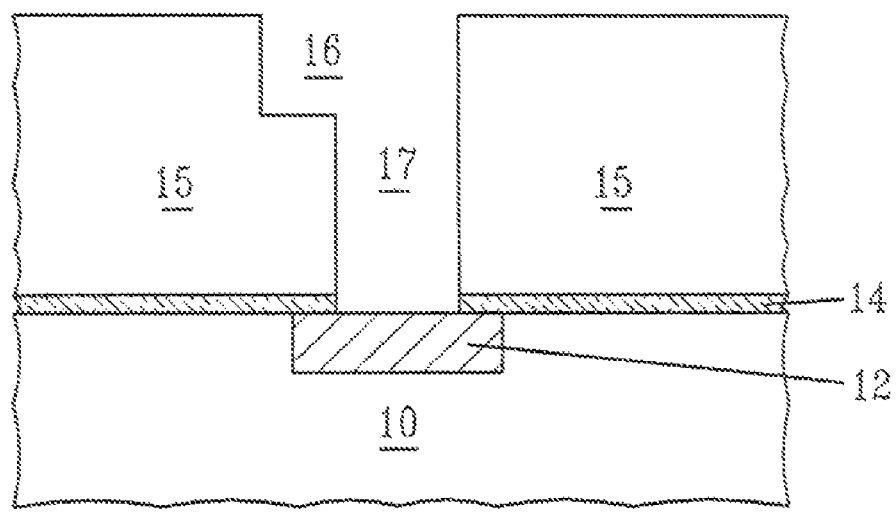
FIGS. 1A and 1B are representational cross-sectional views of process steps taken to provide a copper interconnect in the prior art.
Figure 1B:
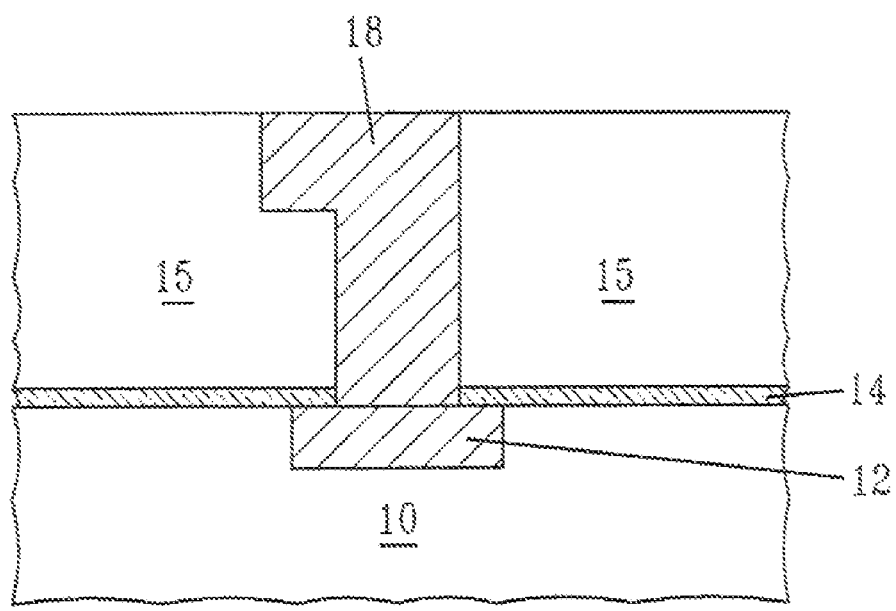
Figure 2A:
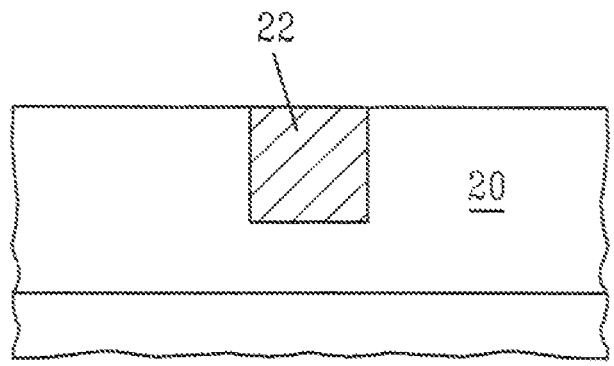
FIGS. 2A to 2F are representational cross-sectional views of process steps of one embodiment of the invention.
Figure 2B:
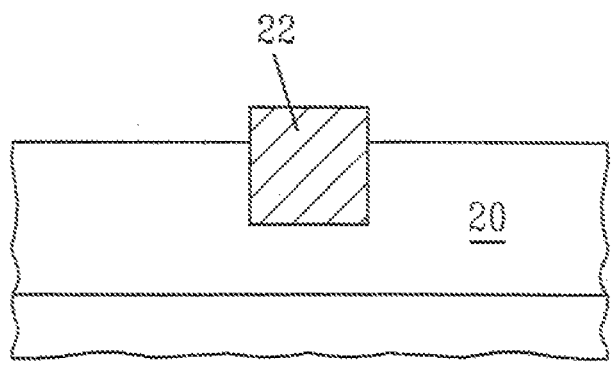
Figure 2C:
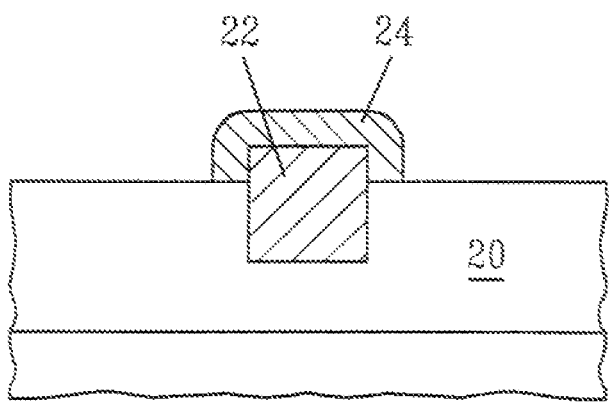
Figure 2D:
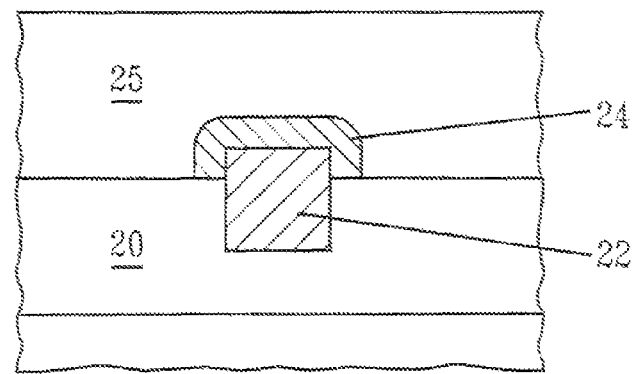
Figure 2E:
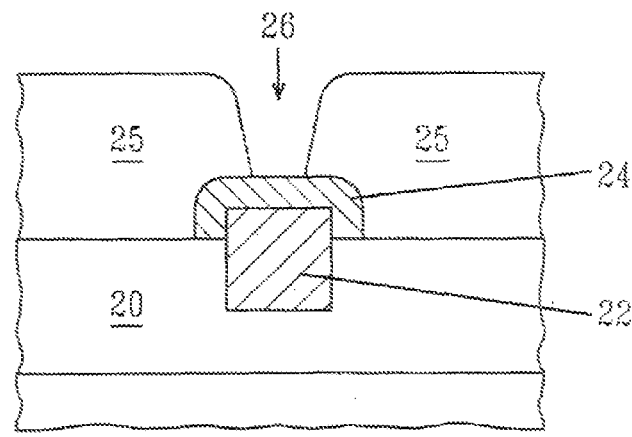
Figure 2F:
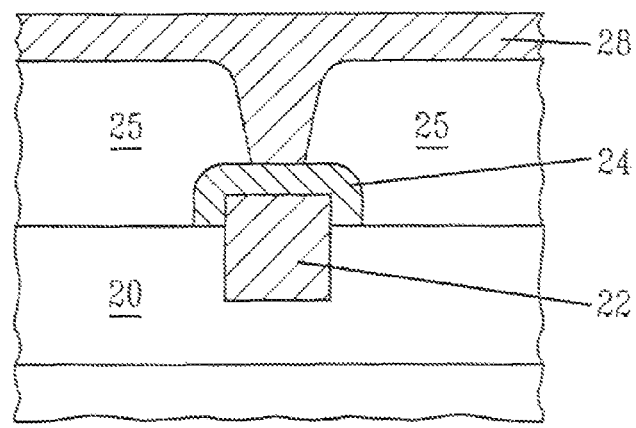

One embodiment of the method is represented by FIGS. 2A to 2F. FIG. 2A depicts providing an interconnect structure 22 such as a copper via or copper line in dielectric 20. An upper portion of the dielectric 20 is removed, e.g., by plasma etching or reactive ion etching, exposing a portion of the interconnect structure, which extends above an upper surface of the dielectric, FIG. 2B. Any processing technique known to one of ordinary skill can be used to remove the upper portion of dielectric 20. An encasing cap 24 is then deposited over the extended portion of the interconnect structure, FIG. 2C. The interlayer dielectric 25 is deposited and patterned such that a bottom surface of the trench 26 or via 26 is disposed over the encasing cap as shown in FIGS. 2D and 2E. The trench or via is then filled with a conducting metal 28, FIG. 2F. The method can also include the deposition of a barrier layer or seed layer prior to depositing the conducting metal.

In one embodiment, the interconnect structure is a line interconnect having a dimensional width W. The encasing cap will have a dimensional width, from about 1.1 W to about 1.6 W. Alternatively, the encasing cap will have a dimensional width from about 1.2 W to about 1.4 W. The second dielectric material is deposited and a via formed such that a bottom surface of the via is disposed over the encasing cap. The additional width of the encasing cap provides a greater tolerance for misalignment of the patterned via in tire second dielectric. As a result, the via is more likely to be fully landed on the line interconnect with the encasing cap. In comparison to a line interconnect in the absence of the encasing cap.

In another embodiment, die interconnect structure is a via interconnect having a dimensional diameter D. The encasing cap will have a dimensional diameter from about from about 1.1 D to about 1.6 D. Alternatively, the encasing cap will have a dimensional width from about 1.2 D to about 1.4 D. The second dielectric material is deposited and a trench formed such that such that a bottom surface of the trench is disposed over the encasing cap. The additional width of the encasing cap provides a greater tolerance for misalignment of the patterned trench in the second dielectric. As a result the trench is more likely to be fully landed on a via with the encasing cap in comparison to a via in the absence of the encasing cap. See, FIGS. 3A and 3B.

Figure 3A:
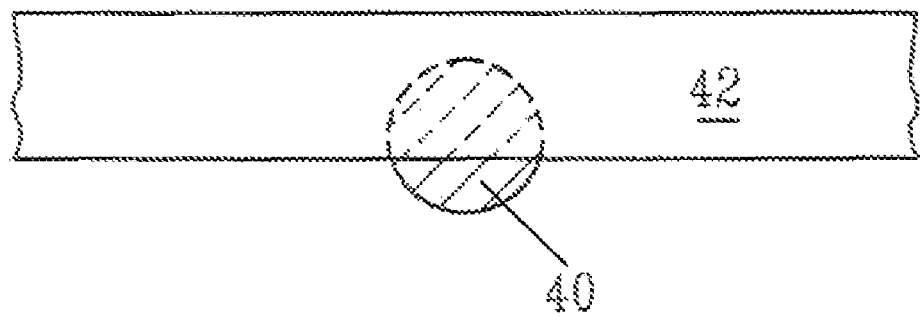
FIGS. 3A and 3B are top view representations depicting one advantage of the invention.
Figure 3B:
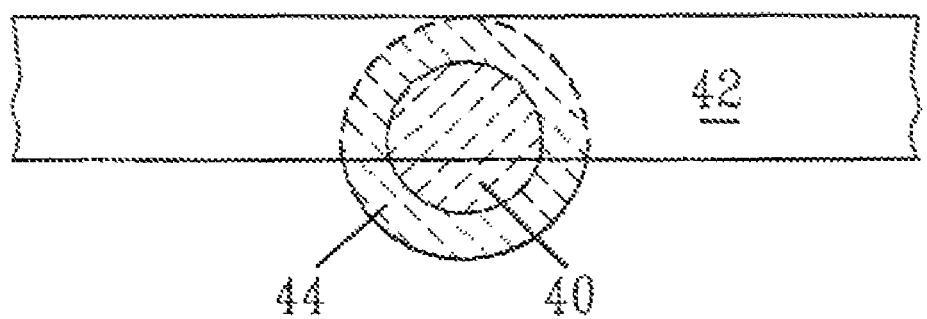

FIG. 3A is a top-view representation of a partially landed line interconnect 42 over underlying via interconnect 40. FIG. 3B is a representation of via 40 with encasing cap 44. As shown, line interconnect 42 is fully landed on encasing cap 44.

The encasing cap can be deposited by an electroless process or an electroplating process. There can be an advantage to using an electroless process because the metal interconnect structure can act as a surface catalyst for the electroless process. The encasing cap can be a conducting metal or metal alloy.

If the encasing cap is a metal alloy several combinations of primary and secondary metals can be used. The primary metal can include, but is not limited to any one metal selected from copper, silver, gold, nickel, palladium, platinum, cobalt, ruthenium, tungsten, rhodium, and iridium. Nickel and cobalt are two primary metals that provide advantageous characteristics such as greater adhesion to the conducting metal or greater resistance of the conducting metal to migrate, particularly if the conducting metal is copper. The secondary metal can include, but is not limited to, one or more metals selected from chromium, molybdenum, tungsten, manganese, ruthenium and rhenium. The alloy is likely to incorporate boron or phosphorus as well.

In one embodiment, nickel is a primary metal for an electroless plated encasing cap. An electroless plating solution containing a nickel solution is used to form an encasing cap. Exemplary metallic encasing caps containing nickel include NiB, NiBP, NiCrB, NiCrBP, NiMoB, NiMoBP, NiWB, NiWBP, NiMnB, NiMnRP, NiRe, and NiReBP.

Alternatively, the encasing cap alloy can include both primary metals nickel and cobalt. Exemplary metallic encasing caps include NiCoB, NiCoBP, NiCoCrB, NiCoCrBP, NiCoMoB, NiCoMoBP, NiCoWB, NiCoWBP, NiCoMnB, NiCoMnSP, NiCoReB and NiCoReBP.

In another embodiment, cobalt is a primary metal for an electroless plated encasing cap. An electroless plating solution containing a cobalt solution is used to form an encasing cap. Exemplary metallic encasing caps containing cobalt include CoB, CoBP, CoCrB, CoCrBP, CoMoB, CoMoBP, CoWB, CoWBP, CoMnB, CoMnBF, CoReB and CoReBP.

Alternatively, the encasing cap alloy can include both primary metals cobalt and palladium. Exemplary metallic encasing caps include CoPdB, CoPdBP, CoPdCrB, CoPdCrBP, CoPdMoB, CoPdMoBP, CoPdWB, CoPdWBP, CfcPdMhB, CoPdMnBP, CoPdReB and CoPdReBP.

More recently, CoWP has been used to as a capping material for copper. CoWP can be deposited by an electroless process as well as by electrodeposition. Electrodeposited CoWP is described in a U.S. patent application, filed Nov. 18, 2003, which is assigned to International Business Machines, the entire disclosures of which is incorporated herein by reference.

U.S. Pat. No. 5,695,810, the entire disclosure of which is incorporated herein by reference, describes the use of electroless deposited CoWP films as a capping material for copper interconnect structures.

The encasing cap will have a thickness from 200 Å to 1500 Å. Alternatively, the encasing cap will have a thickness from 400 Å to 1000 Å.

The encasing cap is deposited on a portion of the interconnect structure that extends from the upper surface of the dielectric. The exposed portion of the interconnect structure extends from about 15 Å to about 150 Å from the upper surface of the dielectric.

The deposition of the conducting layer can proceed by electrochemical deposition such as electroplating or electroless plating. Examples of suitable copper electroplating compositions are disclosed in U.S. patent application Ser. No. 09/348,632, assigned to International Business Machines, the entire disclosure of which is incorporated herein by reference. Other materials such as aluminum, tungsten, gold, silver or an alloy thereof can also be used.

A number of copper alloys can also be used as a conducting metal. Suitable copper alloys include copper-magnesium (Cu—Mg), copper-nickel (CuNi), copper-tin (CuSn), copper-indium (Cain), copper-cadmium (CuCd), copper-zinc (CuZn), copper-bismuth (CuBi), copper-ruthenium (CuRu), copper-rhodium (CuRh), copper-rhenium (CuRe), copper-tungsten (CuW), copper-cobalt (CuCo), copper-palladium (CnPd), copper-gold (CuAu), copper-platinum (CuPt), and copper-silver (CuAg). Alloys are formed by one of two methods. Typically, copper-tin, copper-indium, copper-cadmium, copper-bismuth, copper-ruthenium, copper-rhenium, copper-rhodium, and copper-tungsten are electroplated. Alternatively, copper may fee doped with catalytic metals such as silver, platinum, tin, rhodium, and ruthenium.

A barrier layer that minimizes interconnect material diffusion, such as copper diffusion into the interlayer dielectric can be deposited on the surfaces of the trench or via patterned into the interlayer dielectric. Exemplary harrier layers include metals such as tantalum (Ta), tungsten (W), titanium (Ti), cobalt (Go), combinations thereof, and other refractory metals. Other examples include nitrides such as tantalum nitride (TaN), tungsten nitride (WN), titanium nitride (TiN), combinations thereof and other refractory metal nitrides. Other examples include silicon nitrides such as tantalum, silicon nitride (TaSiN), tungsten silicon nitride (WSiN), titanium silicon nitride (TiSiN), combinations thereof, and other refractory metal silicon nitrides. A barrier layer can fee deposited by conventional techniques such as chemical vapor deposition (CVD) or physical vapor deposition (PVD).

One barrier layer of the invention is described in U.S. patent application Ser. No. 10/132,173, filed Apr. 26, 2002, now U.S. Pat. No. 6,787,912 and U.S. patent application Ser. No. 10/279,057, hied Oct. 24, 2002, now U.S. Pat. No. 6,812, 143, the entire disclosures of which are incorporated herein by reference. Both U.S. patents are assigned to International Business Machines.

The dielectric layers used to provide the interconnect structures of the invention can be any suitable dielectric layer used in the semiconductor manufacturing industry such as an oxide, e.g., silicon dioxide, nitride, silicon nitride, or an oxynitride layer. Low-k dielectric materials, e.g., SiLK® from Dow Chemical, Coral® from Novellus, Black Diamond® from Applied Materials and spin-on silicon-based dielectrics, can also be used. The Coral® can be described genetically as a SiCOH dielectric. The dielectric layer can be formed by any of various methods, including by chemical svapor deposition and spin-on techniques. Dielectric materials described in U.S. Pat. Nos. 6,147,009, which issued Nov. 14, 2000, and 6,441,491, which issued on Aug. 27, 2002, the entire disclosures of which are incorporated herein by reference, and both of which are assigned to International Business Machines, can also be used to form the interconnect structures of the invention.

We claim:

1. A method of making an interconnect structure comprising:
    providing an interconnect structure in a dielectric material,
    recessing the dielectric material such that a portion of the interconnect structure extends above an upper surface of the dielectric material,
    depositing an encasing cap over the extended portion of the interconnect structure; and wherein the encasing cap is a metal alloy with a primary metal of nickel or cobalt.

2. The method of claim 1 further comprising depositing an interlayer dielectric material above the encasing cap.

3. The method of claim 2 further comprising forming a trench or via in the interlayer dielectric material such that a bottom surface of the trench or the via is disposed over the encasing cap.

4. The method of claim 2 wherein the interconnect structure is a line interconnect having a dimensional width W, and the cap has a dimensional width from about 1.1 W to about 1.6 W.

5. The method of claim 4 wherein the cap has a dimensional width from about 1.2 W to about 1.4 W.

6. The method of claim 4 further comprising forming a via in the interlayer dielectric material such that a bottom surface of the via is disposed over the encasing cap.

7. The method of claim 1 wherein the encasing cap is deposited by an electroless process.

8. The method of claim 1 wherein the encasing cap is CoWP.

9. The method of claim 2 wherein the interconnect structure is a via with a dimensional diameter D, and the cap has a dimensional diameter from about 1.1 D to about 1.6 D.

10. The method of claim 9 wherein the cap has a dimensional diameter from about 1.2 D to about 1.4 D.

11. The method of claim 9 further comprising forming a trench is the interlayer dielectric material such that a bottom surface of the trench is disposed over the encasing cap.

12. The method of claim 1 wherein the encasing cap has a thickness from 200 Å to 1500 Å.

13. The method of claim 1 wherein the extended portion of the interconnect structure is from about 15 Å to about 150 Å.

14. A method of making an interconnect structure comprising:
    providing an interconnect line structure in a dielectric material,
    recessing the dielectric material in a region adjacent to the interconnect line structure such that a portion of the interconnect line structure extends above an upper surface of the dielectric material;
    depositing an encasing cap over the extended portion of the interconnect line structure, wherein the interconnect line structure has a dimensional width W, and the cap has a dimensional width from about 1.1 W to about 1.6 W;
    depositing an interlayer dielectric material above the encasing cap; and
    forming a via in the interlayer dielectric material such that a bottom surface of the via is disposed over the encasing cap.

15. A method of making an interconnect structure comprising:
    providing an interconnect via structure in a dielectric material,
    recessing the dielectric material in a region adjacent to the interconnect via structure such that a portion of the interconnect via structure extends above an upper surface of the dielectric material;
    depositing an encasing cap over the extended portion of the interconnect via structure, wherein the diameter of the interconnect via structure has a dimensional diameter D, and the cap has a dimensional diameter from about 1.1 D to about 1.6 D;
    depositing an interlayer dielectric material above the encasing cap; and
    forming a trench in the interlayer dielectric material such that a bottom surface of the trench is disposed over the encasing cap.

16. An interconnect structure comprising a metal conductor disposed in a dielectric material with a portion of the metal conductor extending above a surface of the dielectric material wherein the extending portion of the metal conductor is encased with a cap, wherein the extended portion of the interconnect structure is from about 15 Å to about 150 Å.

17. The interconnect structure of claim 16 wherein the metal conductor is a line interconnect or an interconnect via.

18. The interconnect structure of claim 16 wherein the metal conductor is a line interconnect having a dimensional width W, and the encasing cap has a dimensional width from about 1.1 W to about 1.6 W.

19. The interconnect structure of claim 18 wherein cap has a dimensional, width from about 1.2 W to about 1.4 W.

20. The interconnect structure of claim 16 wherein the interconnect structure is a via with a dimensional diameter D, and the encasing cap has a dimensional diameter from about 1.1 D to about 1.6 D.

21. The interconnect structure of claim 16 wherein the cap has a dimensional diameter from about 1.2 D to about 1.4 D.

22. The interconnect structure of claim 16 wherein, the encasing cap has a thickness from 200 Å to 1500 Å.

* * * * *